United States Patent
Jen et al.

(10) Patent No.: US 6,495,440 B2
(45) Date of Patent: Dec. 17, 2002

(54) METHOD TO PREVENT AN ITO FROM OPENING

(75) Inventors: Tean-Sen Jen, Taoyuan Hsien (TW); Ming-Tien Lin, Taipei Hsien (TW)

(73) Assignee: Hannstar Display Corp., Taipei (TW)

( * ) Notice: Subject to any disclaimer, the term of this patent is extended or adjusted under 35 U.S.C. 154(b) by 30 days.

(21) Appl. No.: 09/846,300

(22) Filed: May 2, 2001

(65) Prior Publication Data

US 2002/0110961 A1 Aug. 15, 2002

(30) Foreign Application Priority Data

Feb. 9, 2001 (TW) ........................................ 90102871 A

(51) Int. Cl.[7] ......................... H01L 21/44; H01L 21/00; H01L 21/84
(52) U.S. Cl. ......................... 438/608; 438/30; 438/149; 438/158; 438/609
(58) Field of Search ............................... 438/608, 609, 438/926, 151, 149, 30, 158

(56) References Cited

U.S. PATENT DOCUMENTS

| | | | |
|---|---|---|---|
| 4,877,483 A | * | 10/1989 | Bergemont et al. ........... 216/18 |
| 4,929,059 A | * | 5/1990 | Takahashi ..................... 349/52 |
| 5,039,622 A | * | 8/1991 | Ishihara ....................... 438/156 |
| 5,174,857 A | * | 12/1992 | Sung ............................ 216/48 |
| 5,182,235 A | * | 1/1993 | Eguchi ......................... 438/618 |
| 5,270,229 A | * | 12/1993 | Ishihara ....................... 438/158 |
| 5,278,009 A | * | 1/1994 | Iida et al. ....................... 430/7 |
| 5,650,692 A | * | 7/1997 | Vetanen et al. ............. 313/506 |
| 5,724,111 A | * | 3/1998 | Mizobata et al. ........... 349/112 |
| 5,789,298 A | * | 8/1998 | Gardner et al. ............. 438/286 |
| 6,121,136 A | * | 9/2000 | Sung ............................ 438/624 |
| 6,133,062 A | * | 10/2000 | Pai et al. ..................... 438/697 |
| 6,163,356 A | * | 12/2000 | Song et al. ................. 349/152 |

* cited by examiner

Primary Examiner—Matthew Smith
Assistant Examiner—Lex H. Malsawma
(74) Attorney, Agent, or Firm—Birch, Stewart, Kolasch & Birch, LLP

(57) ABSTRACT

The present invention provides a method to prevent an ITO from opening. A dummy material layer with tapered edges is formed on a substrate. A first insulating layer is formed on the dummy material layer. Then a metal layer is formed on the first insulating layer, wherein one edge of the metal layer corresponds to any part of one of the tapered edges of the dummy material layer and the other tapered edge is situated away from the metal layer. After a second insulating layer is formed on the metal layer, an ITO layer is formed thereon without opening.

12 Claims, 3 Drawing Sheets

METHOD TO PREVENT AN ITO FROM OPENING

BACKGROUND OF THE INVENTION

1. Field of the Invention

The present invention relates in general to a method of fabricating a liquid crystal display (LCD). In particular, the present invention relates to a method of forming an opening-free ITO (indium tin oxide).

2. Description of the Related Art

ITO is generally used as electrode or contact layer in LCD technology. When the ITO is deposited, in order to prevent the ITO from becoming poly-ITO, thereby rendering the etching of the ITO incomplete and resulting in an ITO to ITO short, the thickness of the ITO is controlled at 400 $\mu$m or thereabouts. However, the thin ITO has a distinct disadvantage. The thin ITO crosses the second metal layer (about 3000 $\mu$m), whose taper easily causes opening. If the second metal layer is a tri-layered metal layer, it easily comes across under cutting, inducing the ITO to open.

FIG. 1 depicts the ITO with an opening according to the prior art. A first metal layer (not shown) used as a gate is formed on a substrate 10. A gate insulating layer 14 is formed thereon.

A second metal layer 16, the tri-layered metal layer of Mo(16a)/Al(16b)/Mo(16c), is formed on the gate insulating layer 14. An insulating layer 18, used as passivation layer, is formed thereon. Then an ITO layer 20 with a thickness of 400–500 $\mu$m is deposited on the insulating layer 18. When etching the metal layer 16, a Mo/Al/Mo tri-layered structure, the Al layer 16b has under cutting (labeled as 22), causing the insulating layer 18 to produce tear-drops, or recesses, 24. This occurs because the material of the middle Al layer 16b is different from the other two layers 16a and 16c. Moreover, the ITO layer 20 is so thin that it easily opens at the tear-drops 24, therefore affecting the electrical properties of the whole structure.

Additional prior art, intended as a solution, is shown in FIG. 2. The second metal layer 36 corresponding to the edge of the ITO layer 40 is designed in a twisting pattern to enlarge the circumference in the area to enhance the effectiveness of the contact area of the ITO layer 40. However, actual opening is not completely prevented. Hence, prior art cannot thoroughly resolve the opening of the ITO layer 40.

SUMMARY OF THE INVENTION

The object of the present invention is to provide a method to prevent the ITO from opening at the tapered edge of the underlayer.

To achieve the above-mentioned object, a method to prevent an ITO from opening, comprising the following steps is provided. A dummy material layer with tapered edges is formed on a substrate. A first insulating layer is formed on the dummy material layer. A metal layer is formed on the first insulating layer, one edge of the metal layer corresponding to one of the tapered edges of the dummy material layer and the other tapered edge situated away from the edge of the metal layer. A second insulating layer is formed on the metal layer. An ITO layer without opening around the edge of the metal layer is formed on the second insulating layer.

According to the embodiment of the present invention, the dummy material layer is metal and the thickness of the ITO layer is between 400 $\mu$m and 500 $\mu$m. Moreover, a gate can be formed with the dummy material layer, that is, both the gate and the dummy material layer belong to the first metal layer.

If the above-mentioned method is used to form a bottom gate structure, an etching stop layer, made of silicon nitride, is formed substantially corresponding to the dummy material layer on the gate insulating layer.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE PREFERRED EMBODIMENT

First Embodiment

Figure 1:
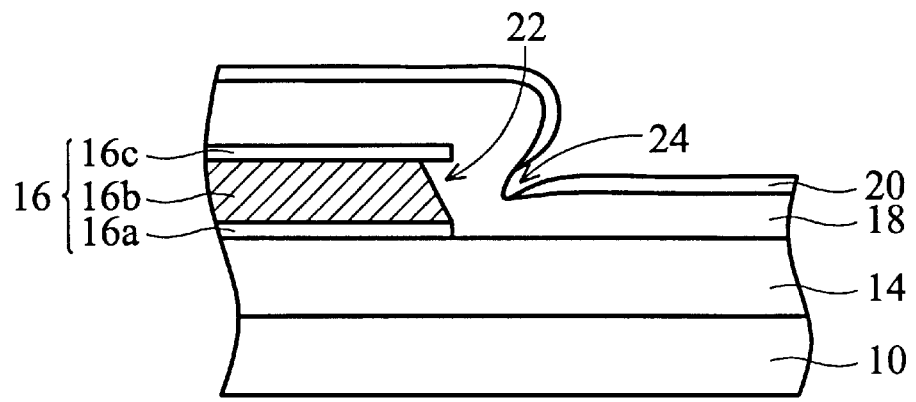
FIG. 1 shows a diagram of an: ITO opening according to the prior art.
Figure 2:
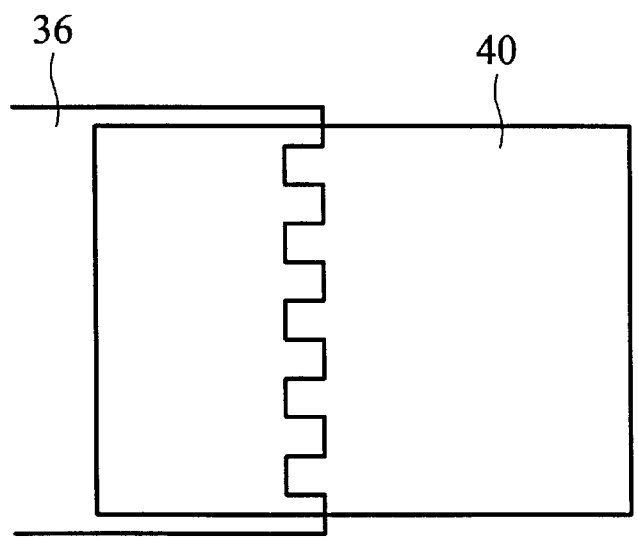
FIG. 2 shows a layout of the second metal layer, conventionally used to resolve the ITO opening problem as in the prior art.
Figure 3:
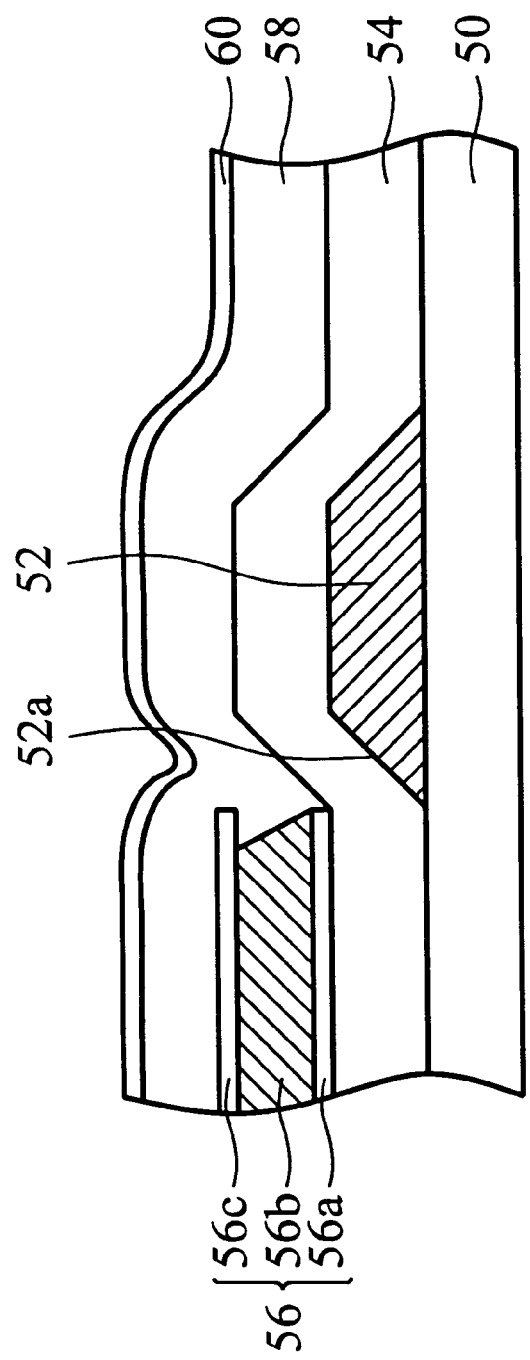
FIG. 3 shows a cross-sectional view of a structure which is formed by the method to prevent the ITO from opening according the first embodiment of the present invention.

Reffering to FIG. 3, firstly, a substrate 50 is provided, and a dummy material layer 52 is formed thereon. If the dummy material layer 52 is made of metal, then the dummy material layer 52 can be formed with a gate (not shown) at the same time. In this situation, both of the dummy material layer 52 and the gate belong to the first metal layer. The dummy material layer 52 has tapered edges 52a, and one of the tapered edges 52a is corresponding to one edge of the to-be-formed-second metal layer.

Then, an insulating layer 54 is formed on the first metal layer which comprises the dummy material layer 52 and the gate. If the dummy material layer 52 belongs to parts of the first metal layer, the insulating layer 54 is a gate insulating layer. A second metal layer 56, such, as a tri-layered structure of Mo(56a)/Al(56b)/Mo(56c), is formed on the insulating layer 54. Another insulating layer 58 as a passivation layer is formed on the metal layer 56. An ITO layer 60 is formed on the insulating layer 58. The thickness of the ITO layer is between 400 $\mu$m and 500 $\mu$m.

The above-formed dummy material layer 52 has tapered edges 52a with an angle of inclination of about 30~600 and a thickness of about 2000~3000 $\mu$m. The thickness of one of the tapered edges 52a, corresponding to the edge of the second metal layer 56, is increased along the direction, of leaving the metal layer 56. Parts of the tapered edge 52a can be disposed below the second metal layer 56, or the end line of the tapered edge 52a can approach the second metal layer 56. The purpose of the disposition of the. dummy material layer 52 is to use the three-dimensional structure of the tapered edges 52a to reduce the drop height of the insulating layer 58 corresponding to the edges of the metal layer 56. Therefore, the ITO layer 60 can maintain contact and enhance the electrical properties and yield of the structure.

Second Embodiment

Figure 4:
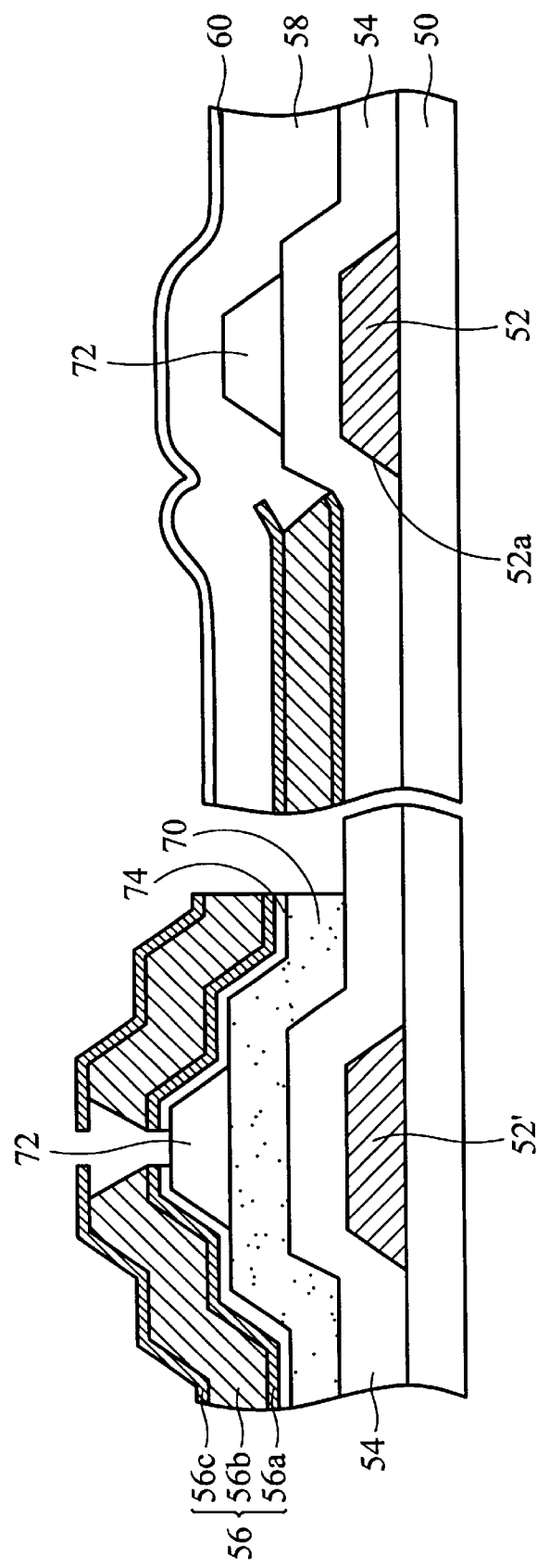
FIG. 4 shows a cross-sectional view of another structure which is formed by another method to prevent the ITO from opening according the second embodiment of the present invention.

The above-mentioned method can be applied to fabricate the bottom gate structure, as shown in FIG. 4, in which the meaning of those symbols are the same as in FIG. 3. After forming the gate 52' and the dummy material layer 52, an insulating layer 54 is formed thereon. An amorphous silicon layer 70 is then formed over the insulating layer 52 corresponding to the TFT active region, and an etching stop layer 72, such-as a silicon nitride layer, is formed over the gate 52' and the dummy material layer 52 to protect the amorphous silicon layer 70. The etching stop layer 72 is directly formed on the insulating layer 54 outside the TFT active region. Then N$^+$-doped layer 74, a second metal layer 56, a passivation layer 58 and an ITO layer 60 are sequentially formed. The N$^+$-doped layer 74 and the amorphous silicon layer 70 are etched together after forming the N$^+$-doped layer 74.

The dummy material layer 52, as described in the first embodiment, has tapered edges 52a with an angle of inclination of about 30~60° and had a thickness of about 2000~3000 μm. The thickness of one of the tapered edges 52a, corresponding to the edge of the second metal layer 56, is increased along the direction of leaving the second metal layer 56. Parts of such tapered edge 52a can be disposed below the second metal layer 56, or the end line of such tapered edge 52a can near the second metal layer 56. The purpose of the disposition of the dummy material layer 52 is to use the three-dimensional structure of the tapered edges 52a to reduce the drop height of the insulating layer 58 corresponding to the edges of the metal layer 56. Therefore, the ITO layer 60 can keep linking and enhance the electrical properties and yield of the products.

According to the above-mentioned description, the present invention at least has the following advantages and characteristics. When forming the first metal layer, not only the gate but also the dummy material layer with tapered edges is defined. The tapered edge of the dummy material layer is located on the edge of the second metal layer to reduce the drop height of the passivation layer to prevent the formation of a tear-drop. The dummy material layer is formed with the gate, therefore, no additional process is needed and costs are not increased.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method to prevent an ITO from opening, comprising:

providing a substrate;

forming a dummy material layer with tapered edges on the substrate;

forming a first insulating layer on the dummy material layer;

forming a metal layer on the first insulating layer, wherein one edge of the metal layer corresponds to any part of one of the tapered edges of the dummy material layer and the other one of the tapered edges of the dummy material layer is away from the edge of the metal layer;

forming a second insulating layer on the metal layer; and forming an ITO layer on the second insulating layer.

2. The method as claimed in claim 1, wherein the tapered edges of the dummy material layer have an angle of inclination between 30° and 60°.

3. The method as claimed in claim 1, wherein the dummy material layer is made of metal.

4. The method as claimed in claim 1, wherein the dummy material layer is made with a gate at the same time.

5. The method as claimed in claim 4, wherein the first insulating layer is a gate insulating layer.

6. The method as claimed in claim 5, further comprising: an etching stop layer formed substantially corresponding to the dummy material layer on the gate insulating layer.

7. The method as claimed in claim 6, wherein the etching stop layer is made of silicon nitride.

8. The method as claimed in claim 1, wherein the thickness of the metal layer is between 2000 μm and 3000 μm.

9. The method as claimed in claim 1, wherein the metal layer is a tri-layered metal layer.

10. The method as claimed in claim 9, wherein the tri-layered metal layer is Mo/Al/Mo.

11. The method as claimed in claim 1, wherein the thickness of the ITO layer is between 400 μm and 500 μm.

12. The method as claimed in claim 1, wherein the second insulating layer is a passivation layer.

* * * * *